United States Patent
MacDonald, Jr. et al.

[11] Patent Number: 5,885,710
[45] Date of Patent: Mar. 23, 1999

[54] FLEXIBLE STRIP TRANSMISSION LINE

[75] Inventors: James D. MacDonald, Jr.; Walter M. Marcinkiewicz, both of Apex, N.C.

[73] Assignee: Ericsson, Inc., Research Triangle Park, N.C.

[21] Appl. No.: 824,472

[22] Filed: Mar. 26, 1997

[51] Int. Cl.$^6$ ............................. D02G 3/00; H01B 7/34
[52] U.S. Cl. ................. 428/375; 174/117 F; 174/36
[58] Field of Search ............. 174/117 F, 117 FF, 174/36; 428/375

[56] References Cited

U.S. PATENT DOCUMENTS

| | | | |
|---|---|---|---|
| 2,952,728 | 9/1960 | Yokose | 174/117 F |
| 3,168,617 | 2/1965 | Richter | 174/117 FF |
| 3,239,916 | 3/1966 | Love | 29/155.5 |
| 3,576,723 | 4/1971 | Angele et al. | 174/117 FF |
| 3,757,029 | 9/1973 | Marshall | 174/36 |
| 4,075,420 | 2/1978 | Walton | 174/117 FF |
| 4,346,145 | 8/1982 | Choi et al. | 428/375 |
| 4,409,427 | 10/1983 | Plummer | 174/36 |
| 4,644,092 | 2/1987 | Gentry | 174/36 |
| 4,645,868 | 2/1987 | Suzuki | 174/36 |
| 4,783,579 | 11/1988 | Brandolf et al. | 174/117 FF |
| 4,972,041 | 11/1990 | Crawley et al. | 174/36 |
| 5,068,632 | 11/1991 | Champeau | 174/36 |
| 5,112,419 | 5/1992 | Nakagawa | 156/51 |
| 5,235,132 | 8/1993 | Ainsworth et al. | 174/36 |
| 5,250,127 | 10/1993 | Hara | 156/52 |
| 5,281,765 | 1/1994 | Iura et al. | 174/117 F |
| 5,283,390 | 2/1994 | Hubis et al. | 174/36 |
| 5,293,001 | 3/1994 | Gebs | 174/36 |
| 5,313,017 | 5/1994 | Aldissi | 174/36 |
| 5,371,324 | 12/1994 | Kanno et al. | 174/117 FF |
| 5,373,103 | 12/1994 | Orr, Jr. et al. | 174/36 |
| 5,397,855 | 3/1995 | Ferlier | 174/36 |
| 5,414,213 | 5/1995 | Hillburn | 174/36 |
| 5,455,383 | 10/1995 | Tanaka | 174/117 FF |
| 5,473,113 | 12/1995 | Aldissi | 174/36 |
| 5,477,011 | 12/1995 | Singles et al. | 174/36 |
| 5,483,020 | 1/1996 | Hardie et al. | 174/36 |
| 5,509,204 | 4/1996 | Sadigh-Behzadi | 174/117 FF |

FOREIGN PATENT DOCUMENTS

| | | |
|---|---|---|
| 34 33 834 A1 | 3/1985 | Germany. |
| 03 199446 | 8/1991 | Japan. |
| 2 058 439 | 4/1981 | United Kingdom. |
| WO 94/07283 | 3/1994 | WIPO. |

*Primary Examiner*—William Krynski
*Assistant Examiner*—Cathy F. Lam
*Attorney, Agent, or Firm*—Jenkens & Gilchrist, P.C.

[57] ABSTRACT

A flexible strip transmission line is disclosed. The flexible strip transmission lines consists of a plurality of flexible layers enabling the transmission line to be folded or repeatably bent. The central layer consists of a flexible dielectric material. On opposing side of the dielectric layer are first and second flexible ground planes formed of a metalized fabric. The flexible ground plane layers are bonded to the dielectric material using a bonding agent such as silicone adhesive. An abrasion resistant material is connected to the outer surface of the flexible ground plane layers to provide a protective exterior shell.

18 Claims, 1 Drawing Sheet

FLEXIBLE STRIP TRANSMISSION LINE

BACKGROUND OF THE INVENTION

1. Technical Field of the Invention

The present invention relates to RF strip transmission lines, and more particularly, to a flexible RF strip transmission line constructed of flexible dielectric and ground plane materials to form a stripline structure.

2. Description of Related Art

The continued downsizing of mobile telephone hardware and the development of such features as the "flip" phone wherein a mobile telephone has a portion which folds over another portion of the phone in order to conserve space have generated a variety of problems. The decreased amount of space within a mobile telephone has required the need for the various transmission lines running through the mobile telephone to be folded prior to fixed installation in order to conserve space. Also within the "flip" type mobile telephones, transmission lines running from the main portion of the mobile telephone to the "flip" portion must have the ability to be repeatedly flexed between open and closed positions without destroying the integrity of the transmission lines passing between the two sections.

Current practice involves the use of either coaxial cable or planar stripline structures having a ground plane formed with copper foil or relatively rigid metalization systems. Both of these practices suffer from various shortcomings. Coaxial cables require the use of a separate cable for each signal being transmitted. This requires the installation and routing of each cable and takes a great deal of time. Furthermore, each cable must be individually connected to the mobile telephone circuitry. The use of coaxial cables and connectors requires a great deal of space which is at a premium within smaller mobile telephone models.

Traditional planar stripline systems may not be folded or used within a "flip" portion of a mobile telephone since the metalization employed in forming the upper and lower ground plane is too rigid to enable continuous flexing of the ground planes between the open and closed positions of the "flip" portion. Currently available planar stripline structures can employ patterned openings within the ground plane metalization to enable a degree of flexibility, but this solution limits the effectiveness of the shielding.

Thus, each of the previously used fabrication methods includes significant shortcomings in RF performance, space limitations and manufacturing costs. Ideally, the shielding effectiveness for a transmission line in a mobile telephone should be as close as possible to the shielding of a coaxial cable and be implemented with the fewest elements possible.

SUMMARY OF THE INVENTION

The present invention overcomes the foregoing and other problems with a flexible strip transmission line. The flexible strip transmission line consists of a flexible signal line, covered with dielectric material providing signal transmission. On opposing sides of the flexible dielectric are flexible ground planes formed from a metalized fabric. This structure forms a controlled impedance stripline transmission media. For flexibility, the layers of metalized fabric are connected with the dielectric material layers using a silicone adhesive. To protect the outer surfaces of the metalized fabric layers, an abrasion resistant layer is bonded to the outer surface of the ground plane using a silicone adhesive.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

Figure 1:
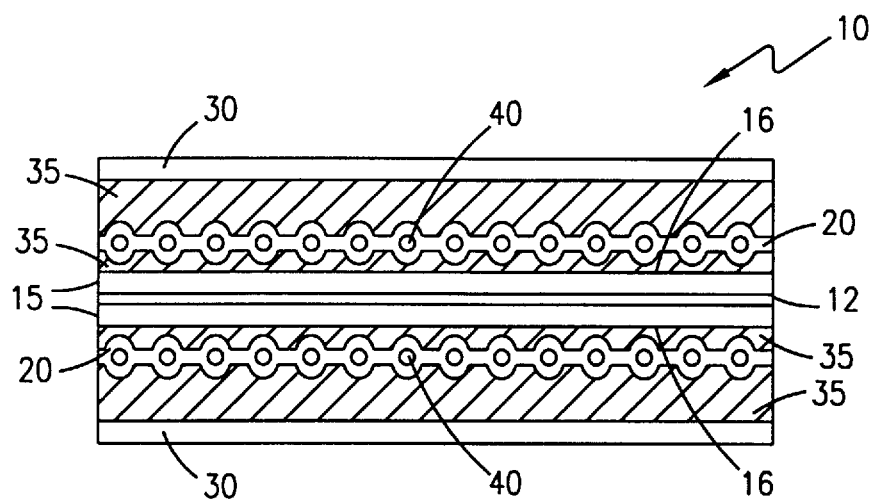
FIG. 1 is a cross-sectional side view of the flexible strip transmission line having a flexible substrate and ground plane.

Referring now to the drawings, and more particularly to FIG. 1, there is illustrated the flexible stripline unit 10 of the present invention. The stripline unit 10 consists of a flexible signal line 12, flexible dielectric layers 15, two flexible ground plane layers 20 bonded to each side 16 of the flexible dielectric layer and a protective layer 30 formed of an abrasion resistant flexible material bonded to the outer surfaces of the flexible ground planes.

The flexible dielectric layer 15 consists of two separate planes 35 that are bonded together over the signal line 12 using a selected heat activated bonding film to match the electrical and mechanical performance requirements of a particular structure. For example, in the case of the dielectric tetrafluoroethylene (TFE), or polytetrafluoroethylene (PFTE) (dielectric constant of approximately 1.8 to 2.2), a fluorinated ethylene propylene (FEP) bonding film could be utilized. With a higher dielectric constant material such as polyetherimide (PEI) (dielectric constant of approximate 3.1), a silicone adhesive would be used.

The width and thickness of the dielectric material layer depends upon the desired controlled impedance characteristics that are necessary. The controlled impedance characteristics also control the selection of the flexible dielectric material to be used. For signal lines 12 with wide trace widths used as a transmitting antenna or for a carrying significant current, a material having a low dielectric constant is desirable in order to enable production of a transmission line, with a given characteristic impedance, having a minimum thickness cross-section that enables minimum bend radius. For traces carrying low current signals, a slightly higher dielectric constant material is desirable to minimize the required trace width for a given dielectric thickness.

The flexible ground plane layers 20 are preferably formed of a metalized fabric providing 80 to 90 dB of shielding effectiveness at the frequency of interest. The metalized fabric will have a plurality of metal fibers 40 running through the body thereof. The metalized fabric should provide strength and resistance to high temperature processing. Two examples of fabric suitable for processing at temperatures of above 200° centigrade include polyester or a liquid crystal polymer (LCP) type cloth.

The use of a silicone adhesive layer 35 to bond the metalized ground plane 20 to the flexible dielectric layer 15 is merely an example of one preferred bonding agent. It should of course be realized that any other bonding agent may be used, or the ground plane layers 20, signal lines 12, and the dielectric layers 15 may be generated via some type of deposition or etching process, as long as the flexible nature of the layers is maintained. The use of a silicone adhesive provides good adhesion to low surface energy dielectrics, such as TFE, PEI or perf luoro alkoxy alkane (PFA). Furthermore, silicone adhesive provides consistent flexibility with high elongation characteristics over a variety of temperature ranges. This is critical in preventing the fracture of the individual metalized fibersg PAL 40 during flexing of the stripline unit 10. Pressure or other means are applied during curing of the silicone adhesive to insure that the silicone completely fills all voids between fibers of the ground plane layers 20.

The protective layers 30 preferably comprise FEP or another abrasion resistant material and is bonded to the ground plane layers 20 using a silicone adhesive layer 35 or other similar adhesive bonding agent. As with the dielectric layer, bonding of the exterior abrasion resistant material may also be accomplished using some type of deposition or etching process.

Figure 2:
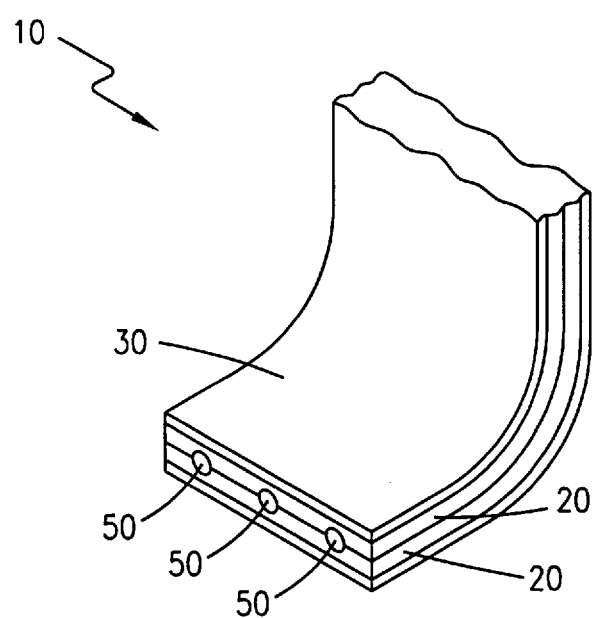
FIG. 2 is a perspective view of an assembled flexible strip transmission line.

Referring now to FIG. 2, there is illustrated a Perspective view, of a stripline unit 10 including three seperate signal lines 50 for transmitting three signals. As illustrated with respect to FIG. 1, the signal lines 12 are covered by flexible dielectric layers 15 (not shown) and the flexible ground planes 20 formed of a metalized fabric. The exterior surfaces of the ground planes are protected by the abrasion resistant layers 30. By incorporating a number of signal lines 50 in a stripline unit 10, a great deal of space savings may be realized over applications using a plurality of coaxial cables. The stripline unit 10 is connected to the telephone circuitry or a printed wiring board through conventional means, such as soldering, displacement connectors, conductive elastomers, or metal compression contacts.

Although a preferred embodiment of the method and apparatus of the present invention has been illustrated in the accompanying Drawings and described in the foregoing Detailed Description, it is understood that the invention is not limited to the embodiment disclosed, but is capable of numerous rearrangements, modifications, and substitutions without departing from the spirit of the invention as set forth and defined by the following claims.

What is claimed is:

1. A flexible strip transmission line comprising:
   a flexible dielectric layer comprises two layers of dielectric material;
   a flexible signal line within the flexible dielectric layer for carrying a signal;
   a first flexible ground plane connected to a first side of the flexible dielectric layer, the firs flexible ground plane comprising a metalized fabric having a plurality of metal fibers therein providing approximately 80 to 90 dB of shielding; and
   a second flexible ground plane connected to the second side of the flexible dielectric layer, a second flexible ground plane comprising a metalized fabric having a plurality of metal fibers therein providing approximately 80 to 90 dB of shielding.

2. The flexible strip transmission line of claim 1 further including:
   a first layer of abrasion resistant material on an outer surface of the first flexible ground plane; and
   a second layer of abrasion resistant material on an outer surface of the second flexible ground plane.

3. The flexible strip transmission line of claim 2 wherein the abrasion resistant material comprises fluorinated ethylene propylene.

4. The flexible strip transmission plane of claim 1 wherein the metalized fabric comprises polyester.

5. The flexible strip transmission line of claim 1 wherein the metalized fabric comprises a liquid crystal polymer cloth.

6. The flexible strip transmission line of claim 1 wherein the first and second flexible ground planes are connected to the first and second sides of the flexible dielectric using a silicone adhesive.

7. The flexible strip transmission line of claim 1 further including means for interconnecting the flexible strip transmission line to a printed wiring board.

8. The flexible strip transmission line of claim 1 further including a plurality of separate flexible signal lines enabling the transmission of a plurality of signals.

9. A flexible strip transmission line, comprising:
   a flexible dielectric layer comprises two layers of dielectric material;
   a flexible signal line within the dielectric layer for transmitting signals;
   a first flexible ground plane formed of a metalized fabric including a plurality of metal fibers therein connected to a first side of the flexible dielectric layer and providing 80 to 90 dB of shielding effectiveness at a selected frequency;
   a second flexible ground plane formed of a metalized fabric including a plurality of metal fibers therein connected to a second side of the flexible dielectric layer and providing 80 to 90 dB of shielding effectiveness at a selected frequency;
   a first rayer of abrasion resistant material on an outer surface of the first flexible ground plane; and
   a second layer of abrasion resistant material on an outer surface of the second flexible ground plane.

10. The flexible strip transmission line of claim 9 wherein the abrasion resistant material comprises fluorinated ethylene propylene.

11. The flexible strip transmission line of claim 9 wherein the first and second flexible ground planes are connected to the first and second sides of the flexible dielectric using a silicone adhesive.

12. The flexible strip transmission line of claim 9 further including means for interconnecting the flexible strip transmission line to a printed wiring board.

13. A flexible strip transmission line, comprising:
   a flexible signal line for carrying signals;
   a flexible dielectric layer comprised of two separate layers of dielectric material bonded together around the flexible signal line;
   a first flexible ground plane formed of a metalized fabric including a plurality of metal fibers therein bonded to a first side of the flexible dielectric layer using a silicone adhesive and providing 80 to 90 dB of shielding effectiveness at a selected frequency, the metal fabric capable of processing at temperatures of greater than 200° centigrade;
   a second flexible ground plane formed of a metalized fabric including a plurality of metal fibers therein bonded to a second side of the flexible dielectric layer using a silicone adhesive and providing 80 to 90 dB of shielding effectiveness at a selected frequency the metal fabric capable of processing at temperatures of greater than 200° centigrade;
   a first layer of abrasion resistant material on an outer surface of the first flexible ground plane; and
   a second layer of abrasion resistant material on an outer surface of the second flexible ground plane.

14. The flexible strip transmission line of claim 13 wherein the abrasion resistant material comprises fluorinated ethylene propylene.

15. The flexible strip transmission plane of claim 13 wherein the metalized fabric comprises polyester.

16. The flexible strip transmission line of claim 13 wherein the metalized fabric comprises a liquid crystal polymer cloth.

17. The flexible strip transmission line of claim 13 further including means for interconnecting the flexible strip transmission line to a printed wiring board.

18. The flexible strip transmission line of claim 13 further including a plurality of separate flexible signal lines enabling the transmission of a plurality of signals.

* * * * *

UNITED STATES PATENT AND TRADEMARK OFFICE
CERTIFICATE OF CORRECTION

PATENT NO.    : 5,885,710
DATED         : March 23, 1999
INVENTOR(S)   : MacDonald et al.

It is certified that error appears in the above-identified patent and that said Letters Patent is hereby corrected as shown below:

Column 2,
Line 63, replace "perf luoro" with -- perfluoro --.
Line 67, replace "fibersg PAL" with "fibers" --.

Column 3,
Line 42, replace "firs" with -- first --.
Line 46, replace "the" with -- a --.
Line 47, replace "a" with -- the --.

Column 4,
Line 24, replace "rayer" with -- layer --.

Signed and Sealed this

Twenty-first Day of August, 2001

Attest:

NICHOLAS P. GODICI
*Attesting Officer*  *Acting Director of the United States Patent and Trademark Office*